United States Patent
Heid

(10) Patent No.: US 8,653,894 B2
(45) Date of Patent: Feb. 18, 2014

(54) PUSH-PULL AMPLIFIER HAVING INDUCTIVE COMMON MODE DECOUPLING

(75) Inventor: Oliver Heid, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 6 days.

(21) Appl. No.: 13/578,046

(22) PCT Filed: Jan. 21, 2011

(86) PCT No.: PCT/EP2011/050804
§ 371 (c)(1),
(2), (4) Date: Aug. 9, 2012

(87) PCT Pub. No.: WO2011/098336
PCT Pub. Date: Aug. 18, 2011

(65) Prior Publication Data
US 2012/0313707 A1    Dec. 13, 2012

(30) Foreign Application Priority Data

Feb. 10, 2010 (DE) .......................... 10 2010 007 451

(51) Int. Cl.
H03F 3/26 (2006.01)

(52) U.S. Cl.
USPC .......................................... 330/269; 330/252

(58) Field of Classification Search
USPC .............................. 330/269, 252, 69, 255, 262
See application file for complete search history.

(56) References Cited

U.S. PATENT DOCUMENTS

| | | | |
|---|---|---|---|
| 1,964,048 A | 6/1934 | Felix | 343/851 |
| 2,201,345 A | 5/1940 | Spencer | 330/116 |
| 2,509,389 A | 5/1950 | Blake | 370/200 |
| 2,705,265 A | 3/1955 | Hall | 330/69 |
| 2,828,369 A | 3/1958 | Wiggins | 330/123 |
| 4,167,709 A | 9/1979 | Papson | 330/276 |
| 5,477,188 A | 12/1995 | Chawla et al. | 330/269 |
| 6,788,141 B2 * | 9/2004 | Paul et al. | 330/252 |
| 7,697,915 B2 * | 4/2010 | Behzad et al. | 455/311 |
| 7,760,023 B2 * | 7/2010 | Bockelman et al. | 330/258 |
| 8,536,945 B2 * | 9/2013 | Hoogzaad | 330/252 |
| 2003/0179815 A1 | 9/2003 | Kandiar | 375/219 |
| 2012/0313707 A1 | 12/2012 | Heid | 330/269 |

FOREIGN PATENT DOCUMENTS

| | | | |
|---|---|---|---|
| DE | 592184 C | 2/1934 | H01Q 9/16 |
| JP | 1269305 A | 10/1989 | H01L 27/095 |
| WO | 2011/098336 A1 | 8/2011 | H03F 3/26 |

OTHER PUBLICATIONS

Tomcik, D.J. et al., "New Amplifier has Bridge-Circuit Output," Audio, 3 pages, Nov. 1954.
Broskie, John R., "An Experiment," Tube CAD Journal, John Broskie's Guide to Tube Circuit Analysis & Design, www.tubecad.com, 18 pages, Oct. 2003.
Benndorf, M., "Grundschaltungen von Röhrenendstufen," http://www.moehrenbude.de/Moehre/modules.php?name=Content&pa=showpage&pid=53&page=4, 11 pages, Feb. 9, 2010.
International Search Report, Application No. PCT/EP2011/050804, 6 pages, Jun. 29, 2011.

* cited by examiner

Primary Examiner — Henry Choe
(74) Attorney, Agent, or Firm — King & Spalding L.L.P.

(57) ABSTRACT

A push-pull amplifier is provided for amplifying an input signal, having first and second amplifier elements. Each of the amplifier elements has a current-emitting electrode, a current-collecting electrode, and a current-controlling electrode. The input signal is supplied to the current-controlling electrodes of the amplifier elements via a respective input connection and a respective input inductor arranged between the respective input connection and the respective current-controlling electrode. The current-collecting electrodes are connected via a respective supply inductor having a common supply voltage. The current-emitting electrode of each amplifier element is connected to the current-collecting electrode of the other amplifier element via a respective capacitor. The current-emitting electrodes are connected to output connections on which the output signal can be picked up, and to a reference potential via a respective output inductor. The supply inductors of the amplifier elements are inductively coupled to the input inductors and the output inductors of the respectively other amplifier element.

16 Claims, 1 Drawing Sheet

PUSH-PULL AMPLIFIER HAVING INDUCTIVE COMMON MODE DECOUPLING

CROSS-REFERENCE TO RELATED APPLICATIONS

This application is a U.S. National Stage Application of International Application No. PCT/EP2011/050804 filed Jan. 21, 2011, which designates the United States of America, and claims priority to DE Patent Application No. 10 2010 007 451.9 filed Feb. 10, 2010. The contents of which are hereby incorporated by reference in their entirety.

TECHNICAL FIELD

The present disclosure relates to a push-pull amplifier for amplifying an input signal to be amplified to form an output signal, e.g., a push-pull amplifier wherein:
- the push-pull amplifier has a first and a second amplifier element,
- each of the two amplifier elements has a current-emitting electrode, a current-collecting electrode and a current-controlling electrode,
- the input signal is fed to the current-controlling electrodes of the amplifier elements via a respective input terminal,
- the current-collecting electrodes are connected to a common supply voltage, and
- the current-emitting electrodes of the amplifier elements are connected to the current-collecting electrode of the respective other amplifier element via a respective capacitor.

BACKGROUND

Push-pull amplifiers are generally known, e.g., as disclosed in U.S. Pat. No. 2,201,345 A.

U.S. Pat. No. 1,964,048 A and the corresponding German Patent Specification 592 184 disclose, for the purpose of common-mode rejection, connecting a coil arrangement into a line pair, said coil arrangement consisting of two coils that are wound in the same sense and are wound in one another and thus closely coupled to one another.

In order to amplify an input signal to be amplified, it is known to use a half-bridge circuit in which the two active components (transistors, tubes) are connected in series. In this configuration, the so-called "high-side component" has to have a high AC and DC voltage potential with respect to ground. In this configuration, parasitic capacitances for example from the component housing with respect to ground in practice introduce an unbalance into the circuit. Furthermore, the balanced driving of the active components turns out to be difficult owing to the greatly different stray capacitances. Other embodiments having balanced ground reference of the components require a power balancing and combination element, for example a transformer, at the output.

Push-pull amplifiers are also known in which the active and passive components are arranged symmetrically. Thus, by way of example, corresponding circuits are known by the designations customary to those skilled in the art: "parallel push-pull", "circlotron" and push-pull half-bridge circuit, which balance the potentials of the active components in the desired manner.

However, two separate voltage supplies are required for these circuits. Furthermore, the driving is superposed in principle with respectively half of the output voltage, such that the theoretically maximum voltage gain is limited to a factor of 2 and even this value is often not achieved in practice. In the kilohertz frequency range, a so-called "bootstrap circuit" of the driver stage is used in order to reduce this extremely high negative feedback. At higher frequencies, however, this circuit cannot be used owing to the strong interference influence of stray capacitances.

U.S. Pat. No. 2,201,345 cited in the introduction discloses a symmetrically constructed push-pull amplifier in which a common voltage supply is present. However, in this push-pull amplifier, too, the achievable gain is limited to the value of two.

SUMMARY

In one embodiment, a push-pull amplifier is provided for amplifying an input signal to be amplified to form an output signal, wherein the push-pull amplifier has a first and a second amplifier element, wherein each of the two amplifier elements has a current-emitting electrode, a current-collecting electrode and a current-controlling electrode, wherein the input signal is fed to the current-controlling electrodes of the amplifier elements via a respective input terminal and a respective input inductance arranged between the respective input terminal and the respective current-controlling electrode, wherein the current-collecting electrodes are connected to a common supply voltage via a respective supply inductance, wherein the current-emitting electrodes of the amplifier elements are connected to the current-collecting electrode of the respective other amplifier element via a respective capacitor, wherein the current-emitting electrodes are connected to output terminals, at which the output signal can be tapped off, wherein the current-emitting electrodes are connected to a reference potential via a respective output inductance, and wherein the supply inductances of the amplifier elements are inductively coupled to the input inductances and the output inductances of the respective other amplifier element.

In a further embodiment, the amplifier elements are embodied as transistors. In a further embodiment, the transistors are embodied as field effect transistors. In a further embodiment, the inductive coupling of the supply inductance of the first amplifier element to the input inductance and the output inductance of the second amplifier element is effected by a balancing transformer, which at the same time also effects the inductive coupling of the supply inductance of the second amplifier element to the input inductance and the output inductance of the first amplifier element. In a further embodiment, the balancing transformer at the same time also acts as an output transformer for the impedance matching of the output signal. In a further embodiment, the inductive coupling of the supply inductance of the first amplifier element to the input inductance and the output inductance of the second amplifier element and the inductive coupling of the supply inductance of the second amplifier element to the input inductance and the output inductance of the first amplifier element are effected by a dedicated coupling element in each case. In a further embodiment, the coupling elements are embodied as standing-wave traps. In a further embodiment, the input signal has a predetermined input frequency, and in that the standing-wave traps are embodied as quarter-wave lines.

BRIEF DESCRIPTION OF THE DRAWINGS

Example embodiments will be explained in more detail below with reference to figures, in which.

DETAILED DESCRIPTION

Figure 1:
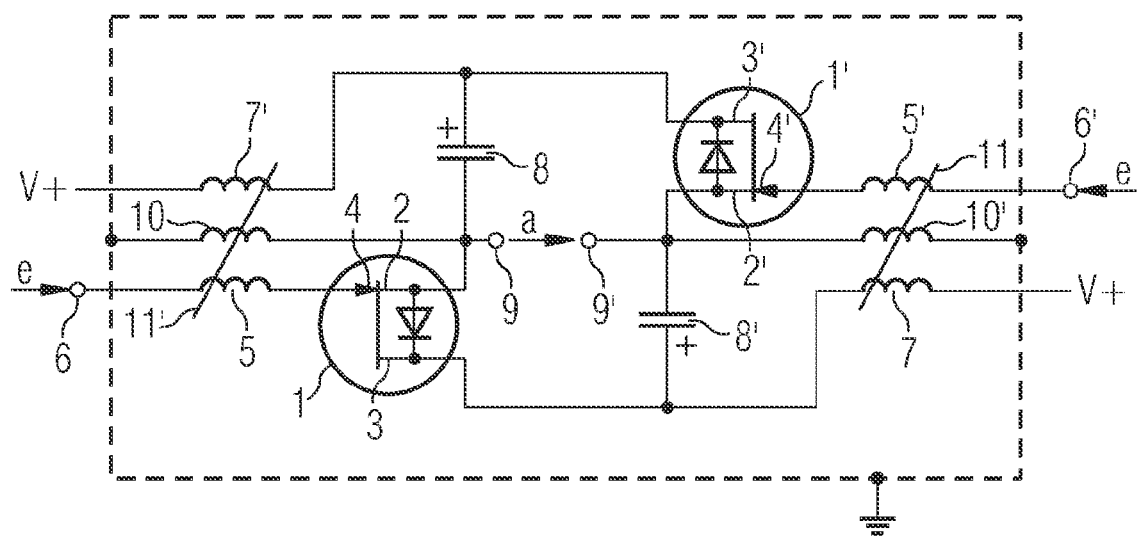
FIGS. 1 and 2 each show a push-pull amplifier, according to example embodiments of the disclosure.

In some embodiments, a symmetrically constructed push-pull amplifier is configured in such a way that it can be operated with a gain factor that is not limited to the value of two from the outset.

For example, some embodiments provide for configuring a push-pull amplifier of the type discussed above by:
- a respective input inductance being arranged between the current-controlling electrodes of the amplifier elements and the input terminals,
- the current-collecting electrodes being connected to the common supply voltage via a respective supply inductance,
- the current-emitting electrodes being connected to output terminals, at which the output signal can be tapped off,
- the current-emitting electrodes being connected to a reference potential via a respective output inductance, and
- the supply inductances of the amplifier elements being inductively coupled to the input inductances and the output inductances of the respective other amplifier element.

The inductive coupling of the supply inductances to the input inductances of the respective other amplifier element may provide a gain factor of the respective amplifier element that is considerably greater than two. Further, by inductively coupling the supply inductance to the output inductance of the respective other amplifier element, the DC voltage supply of the amplifier elements may be uninfluenced by the driving of the amplifier elements.

The amplifier elements may be embodied as tubes, for example as triodes. In some embodiments, however, the amplifier elements are embodied as transistors. Thus, embodiments in the form of bipolar transistors and field effect transistors may be provided.

One possible configuration of the push-pull amplifier provides for the inductive coupling of the supply inductance of the first amplifier element to the input inductance and the output inductance of the second amplifier element to be effected by a balancing transformer, which at the same time also effects the inductive coupling of the supply inductance of the second amplifier element to the input inductance and the output inductance of the first amplifier element. In this case, a structurally simple construction of the push-pull amplifier arises. Furthermore, in this case, the balancing transformer at the same time also acts as an output transformer for the impedance matching of the output signal.

An alternative configuration of the push-pull amplifier provides for the inductive coupling of the supply inductance of the first amplifier element to the input inductance and the output inductance of the second amplifier element and the inductive coupling of the supply inductance of the second amplifier element to the input inductance and the output inductance of the first amplifier element to be effected by a dedicated coupling element in each case. In this case, the output signals are unbalanced relative to the reference potential.

The coupling elements can be embodied as required. They may be embodied as standing-wave traps. If the input signal has a predetermined input frequency, the standing-wave traps can be embodied, in particular, as quarter-wave lines.

In accordance with FIG. 1, a push-pull amplifier has a first and a second amplifier element 1, 1'. Each of the two amplifier elements 1, 1' has a current-emitting electrode 2, 2', a current-collecting electrode 3, 3' and a current-controlling electrode 4, 4'.

The amplifier elements 1, 1' can be embodied as tubes. In this case, the current-emitting electrodes 2, 2' correspond to the cathodes and the current-collecting electrodes 3, 3' correspond to the anodes of the tubes. The current-controlling electrodes 4, 4' are the grid electrodes in this case.

Alternatively, the amplifier elements 1, 1' can be embodied as transistors in the form of bipolar transistors. In this case, the current-emitting electrodes 2, 2' correspond to the emitters and the current-collecting electrodes 3, 3' correspond to the collectors of the transistors. The current-controlling electrodes 4, 4' correspond to the bases of the transistors in this case.

In accordance with the example configuration illustrated in FIG. 1, the amplifier elements 1, 1' are embodied as field effect transistors. In this case, the current-emitting electrodes 2, 2' correspond to the "sources" and the current-collecting electrodes 3, 3' correspond to the "drains" of the field effect transistors. The current-controlling electrodes 4, 4' correspond to the "gates" of the field effect transistors.

In accordance with FIG. 1, the current-controlling electrodes 4, 4' of the amplifier elements 1, 1' are connected to a respective input terminal 6, 6' via a respective input inductance 5, 5'. An input signal e to be amplified is fed to the current-controlling electrodes 4, 4' via the respective input terminal 6, 6'.

The input inductances 5, 5' are completely normal inductances. The term "input inductances" was chosen only in order to be able to linguistically distinguish these inductances from other inductances. The input signal e is an AC voltage signal. It can be decoupled from the push-pull amplifier in terms of DC voltage, for example, by means of coupling-in capacitors that are not illustrated in FIG. 1.

The current-collecting electrodes 3, 3' are connected to a supply voltage V+ via a respective supply inductance 7, 7'. The supply voltage V+ is a common supply voltage that supplies both amplifier elements 1, 1' with electrical energy. The supply voltage V+ is a DC voltage. The supply voltage V+ is positive with respect to ground in accordance with the illustration in FIG. 1.

The supply inductances 7, 7' are—analogously to the input inductances 5, 5'—completely normal inductances. The term "supply inductances" was chosen only in order to be able to linguistically distinguish these inductances from other inductances.

In accordance with FIG. 1, the current-emitting electrodes 2, 2' of the amplifier elements 1, 1' are connected to the current-collecting electrodes 3', 3 of the respective other amplifier element 1', 1 via a respective capacitor 8, 8'. In accordance with FIG. 1, the current-emitting electrodes 2, 2' are furthermore connected to output terminals 9, 9'. An output signal a can be tapped off via the output terminals 9, 9'. The output signal a is amplified relative to the input signal e. A ratio of output signal a to input signal e can be greater than two.

The current-emitting electrodes 2, 2' are furthermore connected to a reference potential via a respective output inductance 10, 10'. The reference potential can be the ground potential in accordance with the illustration in FIG. 1. However, alternatively, a potential that is different than the ground potential can also be involved.

The output inductances 10, 10' are completely normal inductances. The term "output inductances" was only chosen in order to be able to linguistically distinguish these inductances from the other inductances.

As illustrated by oblique lines in FIG. 1, the supply inductances 7, 7' of the amplifier elements 1, 1' are inductively coupled to the input inductances 5', 5 and the output inductances 10', 10 of the respective other amplifier element 1', 1.

The lines therefore correspond to coupling elements 11, 11' that realize the corresponding inductive coupling. The coupling elements 11, 11' can be embodied in each case as a transformer core, for example, onto which the corresponding inductances 7, 5', 10' and 7', 5, 10 are wound.

The inductive coupling is dimensioned in such a way that the induced voltages mutually compensate for one another. The turns ratio should therefore be as close to one as possible. The output voltages present at the output terminals 9, 9' should therefore be fed back as far as possible 1:1 to the current-controlling electrodes 4, 4' of the amplifier elements 1, 1' and to those sides of the capacitors 8, 8' which are connected to the supply potential V+.

The inductances 5, 5', 7, 7', 10, 10' can form two groups of three separated from each other in accordance with the illustration in FIG. 1. In this case, the inductive coupling of the supply inductance 7 of the first amplifier element 1 to the input inductance 5' and the output inductance 10' of the second amplifier element 1' is effected by the coupling element 11. The inductive coupling of the supply inductance 7' of the second amplifier element 1' to the input inductance 5 and the output inductance 10 of the first amplifier element 1 is effected by the coupling element 11' in this case. The coupling elements 11, 11' are mutually different coupling elements 11, 11' in accordance with the configuration in FIG. 1.

The coupling elements 11, 11' can be embodied as standing-wave traps, for example. If the input signal e has a predetermined input frequency (or is sufficiently narrowband), the standing-wave traps can be embodied as quarter-wave lines, for example.

Figure 2:
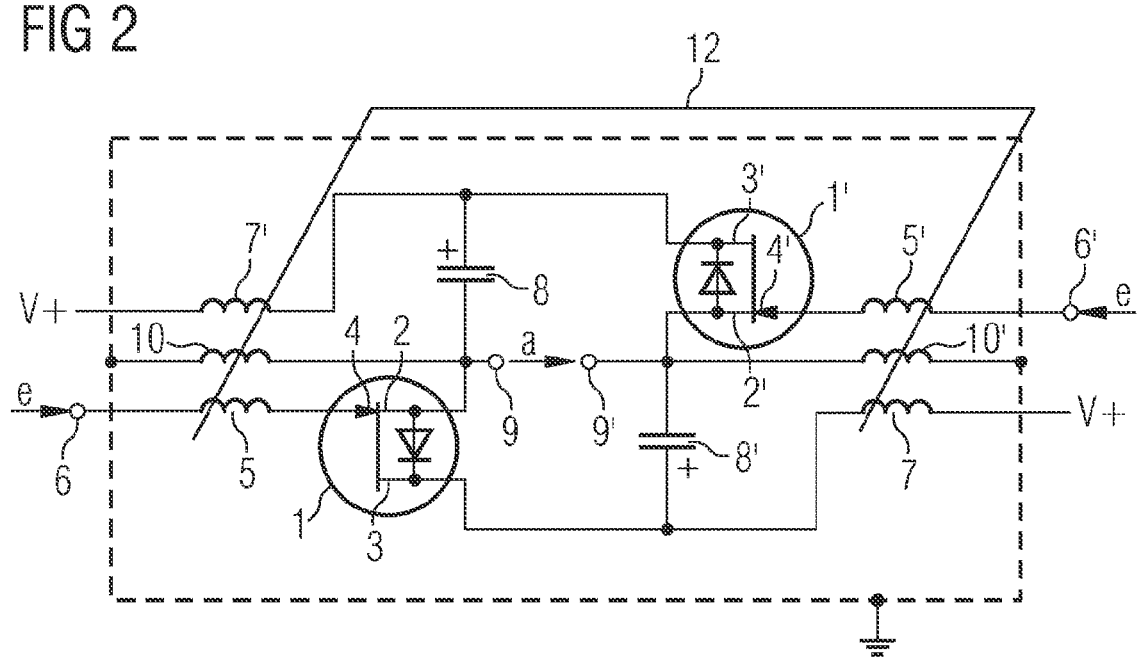

The push-pull amplifier from FIG. 2 substantially corresponds to the push-pull amplifier from FIG. 1. In contrast to the push-pull amplifier from FIG. 1, however, in the case of the push-pull amplifier from FIG. 2, the inductive coupling of the inductances 5, 5', 7, 7', 10, 10' is effected by a (single) balancing transformer 12, onto which all six inductances 5, 5', 7, 7', 10, 10' mentioned are wound. In this case, firstly the reference potential is at the ground potential. Secondly, in this case, the balancing transformer 12 not only effects the inductive coupling of the supply inductance 7 of the first amplifier element 1 to the input inductance 5' and the output inductance 10' of the second amplifier element 1'. The balancing transformer 12' at the same time also effects the inductive coupling of the supply inductance 7' of the second amplifier element 1' to the input inductance 5 and the output inductance 10 of the first amplifier element 1.

Both in the case of the configuration of the push-pull amplifier in accordance with FIG. 1 and in the case of the configuration of the push-pull amplifier in accordance with FIG. 2, an output transformer can be present, by means of which impedance matching of the output signal a is performed. In the case of the configuration of the push-pull amplifier in accordance with FIG. 1, the output transformer has to be embodied as an independent component.

This is also possible, of course, in the case of the configuration of the push-pull amplifier in accordance with FIG. 2. In the case of the configuration of the push-pull amplifier in accordance with FIG. 2, however, as an alternative it is likewise possible, in accordance with the illustration in FIG. 2, for the balancing transformer 12 at the same time also to act as an output transformer for the impedance matching of the output signal a. In this case, it is merely necessary for the windings of the output transformer also to be applied to one and the same transformer core in addition to the inductances 5, 5', 7, 7', 10, 10'.

Some embodiments disclosed herein may solve balancing problems of conventional amplifiers both on the driving side and on the output side, and may decouple the drive signals and the DC voltage supply of the two amplifier branches from the push-pull AC voltage potential of the output. As a result, the great negative feedback that is unavoidable in certain conventional amplifiers may also be canceled. As a result, this may enable gain factors of the push-pull amplifier which are considerably greater than two. For example, gain factors of between 10 and 100 were achieved in experimental testing.

LIST OF REFERENCE SYMBOLS 1, 1' Amplifier elements
2, 2' Current-emitting electrodes
3, 3' Current-collecting electrodes
4, 4' Current-controlling electrodes
5, 5' Input inductances
6, 6' Input terminals
7, 7' Supply inductances
8, 8' Capacitors
9, 9' Output terminals
10, 10' Output inductances
11, 11' Coupling elements
12 Balancing transformer
a Output signal
e Input signal
V+ Supply voltage

What is claimed is:

1. A push-pull amplifier for amplifying an input signal to be amplified to form an output signal, comprising:
   a first amplifier element and a second amplifier element,
   each of the two amplifier elements comprising a current-emitting electrode, a current-collecting electrode, and a current-controlling electrode,
   wherein the input signal is fed to the current-controlling electrodes of the amplifier elements via a respective input terminal and a respective input inductance arranged between the respective input terminal and the respective current-controlling electrode,
   wherein the current-collecting electrodes are connected to a common supply voltage via a respective supply inductance,
   wherein the current-emitting electrodes of the amplifier elements are connected to the current-collecting electrode of the respective other amplifier element via a respective capacitor,
   wherein the current-emitting electrodes are connected to output terminals, at which the output signal can be tapped off,
   wherein the current-emitting electrodes are connected to a reference potential via a respective output inductance, and
   wherein the supply inductances of the amplifier elements are inductively coupled to the input inductances and the output inductances of the respective other amplifier element.

2. The push-pull amplifier of claim 1, wherein the amplifier elements are embodied as transistors.

3. The push-pull amplifier of claim 2, wherein the transistors are embodied as field effect transistors.

4. The push-pull amplifier of claim 1, wherein the inductive coupling of the supply inductance of the first amplifier element to the input inductance and the output inductance of the second amplifier element is effected by a balancing transformer, which at the same time also effects the inductive coupling of the supply inductance of the second amplifier element to the input inductance and the output inductance of the first amplifier element.

5. The push-pull amplifier of claim 4, wherein the balancing transformer at the same time also acts as an output transformer for the impedance matching of the output signal.

6. The push-pull amplifier of claim 1, wherein each of (a) the inductive coupling of the supply inductance of the first amplifier element to the input inductance and the output inductance of the second amplifier element and (b) the inductive coupling of the supply inductance of the second amplifier element to the input inductance and the output inductance of the first amplifier element are effected by a dedicated coupling element.

7. The push-pull amplifier of claim 6, wherein the coupling elements are embodied as standing-wave traps.

8. The push-pull amplifier of claim 7, wherein the input signal has a predetermined input frequency, and wherein the standing-wave traps are embodied as quarter-wave lines.

9. An electronic device, comprising:
   an electronic element configured to generate an input signal; and
   a push-pull amplifier for amplifying the input signal to form an output signal, the push-pull amplifier comprising:
      a first amplifier element and a second amplifier element, each of the two amplifier elements comprising a current-emitting electrode, a current-collecting electrode, and a current-controlling electrode,
      wherein the input signal is fed to the current-controlling electrodes of the amplifier elements via a respective input terminal and a respective input inductance arranged between the respective input terminal and the respective current-controlling electrode,
      wherein the current-collecting electrodes are connected to a common supply voltage via a respective supply inductance,
      wherein the current-emitting electrodes of the amplifier elements are connected to the current-collecting electrode of the respective other amplifier element via a respective capacitor,
      wherein the current-emitting electrodes are connected to output terminals, at which the output signal can be tapped off,
      wherein the current-emitting electrodes are connected to a reference potential via a respective output inductance, and
      wherein the supply inductances of the amplifier elements are inductively coupled to the input inductances and the output inductances of the respective other amplifier element.

10. The electronic device of claim 9, wherein the amplifier elements are embodied as transistors.

11. The electronic device of claim 10, wherein the transistors are embodied as field effect transistors.

12. The electronic device of claim 9, wherein the inductive coupling of the supply inductance of the first amplifier element to the input inductance and the output inductance of the second amplifier element is effected by a balancing transformer, which at the same time also effects the inductive coupling of the supply inductance of the second amplifier element to the input inductance and the output inductance of the first amplifier element.

13. The electronic device of claim 12, wherein the balancing transformer at the same time also acts as an output transformer for the impedance matching of the output signal.

14. The electronic device of claim 9, wherein each of the inductive coupling of the supply inductance of the first amplifier element to the input inductance and the output inductance of the second amplifier element and the inductive coupling of the supply inductance of the second amplifier element to the input inductance and the output inductance of the first amplifier element are effected by a dedicated coupling element.

15. The electronic device of claim 14, wherein the coupling elements are embodied as standing-wave traps.

16. The electronic device of claim 15, wherein the input signal has a predetermined input frequency, and wherein the standing-wave traps are embodied as quarter-wave lines.

* * * * *